(12) United States Patent
Kim et al.

(10) Patent No.: US 7,524,724 B2
(45) Date of Patent: Apr. 28, 2009

(54) METHOD OF FORMING TITANIUM NITRIDE LAYER AND METHOD OF FABRICATING CAPACITOR USING THE SAME

(75) Inventors: Rak-Hwan Kim, Gyeonggi-do (KR);
Hyun-Seok Lim, Gyeonggi-do (KR);
Young-Joo Cho, Gyeonggi-do (KR);
In-Sun Park, Gyeonggi-do (KR);
Hyeon-Deok Lee, Seoul (KR);
Hyun-Suk Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 11/173,771

(22) Filed: Jun. 30, 2005

(65) Prior Publication Data
US 2006/0014385 A1 Jan. 19, 2006

(30) Foreign Application Priority Data
Jul. 15, 2004 (KR) .................. 10-2004-0055004

(51) Int. Cl.
*H01L 21/20* (2006.01)
(52) U.S. Cl. .................. 438/244; 438/253; 438/387; 438/396; 438/397; 438/653; 257/E21.019; 257/E21.059; 257/E21.066; 257/E21.578; 257/E21.584; 257/E27.016; 257/E27.088; 257/E27.097

(58) Field of Classification Search .............. 438/680, 438/396, 238, 479, 761, 627, 643, 653, 244, 438/253, 387, 397, 597, 659; 257/632, 21.125, 257/E21.019, 59, 66, 171, 204, 578, 584, 257/589, 648, 649, 657, E27.016, 88, 97
See application file for complete search history.

(56) References Cited

U.S. PATENT DOCUMENTS 5,420,072 A * 5/1995 Fiordalice et al. .......... 438/607

(Continued)

*Primary Examiner*—Michael S Lebentritt
(74) *Attorney, Agent, or Firm*—Marger Johnson & McCollom, P.C.

(57) ABSTRACT

A method of fabricating a storage capacitor includes depositing a first titanium nitride layer on a dielectric layer using a chemical vapor deposition technique or an atomic layer deposition technique performed at a first temperature with reactant gases of titanium chloride (TiCl$_4$) gas and ammonia (NH$_3$) gas at a predetermined flow ratio and depositing a second titanium nitride layer on the first titanium nitride layer using a chemical vapor deposition process performed at a second temperature that is greater than the first temperature with reactant gases of titanium chloride (TiCl$_4$) gas and ammonia (NH$_3$) gas.

39 Claims, 13 Drawing Sheets

U.S. PATENT DOCUMENTS

| | | | |
|---|---|---|---|
| 6,005,291 A * | 12/1999 | Koyanagi et al. | 257/751 |
| 6,037,252 A | 3/2000 | Hillman et al. | |
| 6,146,991 A * | 11/2000 | Cheng et al. | 438/622 |
| 6,207,557 B1 | 3/2001 | Lee et al. | |
| 6,284,636 B1 * | 9/2001 | Hossain et al. | 438/592 |
| 6,348,376 B2 * | 2/2002 | Lim et al. | 438/253 |
| 6,399,457 B2 * | 6/2002 | Park et al. | 438/393 |
| 6,548,389 B2 * | 4/2003 | Moriwaki et al. | 438/592 |
| 6,548,402 B2 | 4/2003 | Wang et al. | |
| 6,579,809 B1 * | 6/2003 | Yang et al. | 438/734 |
| 6,607,954 B2 * | 8/2003 | Jeon et al. | 438/244 |
| 6,740,585 B2 * | 5/2004 | Yoon et al. | 438/680 |
| 6,750,066 B1 * | 6/2004 | Cheung et al. | 438/3 |
| 6,835,658 B2 * | 12/2004 | Kim et al. | 438/681 |
| 6,846,516 B2 * | 1/2005 | Yang et al. | 427/255.32 |
| 6,916,380 B2 * | 7/2005 | Yang et al. | 118/697 |
| 6,924,195 B2 * | 8/2005 | Yang | 438/253 |
| 6,962,877 B2 * | 11/2005 | Lee | 438/681 |
| 2002/0102818 A1 * | 8/2002 | Sandhu et al. | 438/479 |
| 2002/0195710 A1 * | 12/2002 | Derderian et al. | 257/751 |
| 2005/0138262 A1 * | 6/2005 | Forbes | 711/1 |
| 2005/0277275 A1 * | 12/2005 | Jawarani et al. | 438/581 |

* cited by examiner

METHOD OF FORMING TITANIUM NITRIDE LAYER AND METHOD OF FABRICATING CAPACITOR USING THE SAME

CROSS REFERENCE TO RELATED APPLICATIONS

This application claims priority from Korean Patent Application No. 10-2004-0055004, filed 15 Jul. 2004, the content of which is hereby incorporated by reference in its entirety, for all purposes.

BACKGROUND

1. Technical Field

This disclosure is generally related to semiconductor devices, and, more particularly, to methods of forming a metal electrode from a titanium nitride layer to prevent a leakage current, and to methods of fabricating a storage capacitor having the metal electrode.

2. Description of the Related Art

It is widely known that a memory cell of a semiconductor memory device, such as a dynamic random access memory (DRAM), includes one transistor and one storage capacitor. When the size of the memory cell is reduced in response to an increased degree of integration on the DRAM, the size of the transistor is also reduced as well as the area of the semiconductor substrate occupied by the storage capacitor. For a typical storage capacitor having a two-dimensional planar structure, the reduced area results in a decreased capacitance.

When the capacitance of the storage capacitor is decreased, the signal-to-noise ratio (S/N ratio) deteriorates, and a soft error due to an alpha ($\alpha$) particle may occur. Therefore, even though a high integration level for a DRAM is desirable, the capacitance of the storage capacitor must also be sufficiently ensured.

Many methods have been proposed to achieve this goal, such as reducing the thickness of the dielectric layer, using a dielectric layer having a high dielectric constant, or enlarging an effective area of the storage capacitor.

For example, a storage capacitor having a three-dimensional structure such as a stack type structure or a trench type structure has an increased effective area compared to the planar capacitor structure. The stack type capacitor structure has been further modified to produce a cylindrical-type capacitor or a fin-type capacitor, and the technology has been developed to produce a structure for enlarging the area of the storage electrode.

When a high dielectric material such as $Ta_2O_5$, $Al_2O_3$, or $HfO_2$ is employed for the dielectric layer of the storage capacitor, even though the dielectric constant is increased, the interface characteristics between the dielectric layer and the polycrystalline silicon used as an electrode of the storage capacitor may deteriorate. Furthermore, if the thickness of the dielectric layer is reduced, a leakage current may increase due to tunneling effects. In order to suppress the leakage current, a layer having a low dielectric constant such as a silicon oxynitride (SiON) layer may be interposed between the polycrystalline silicon electrode and the high dielectric layer, but this results in a deteriorated capacitance. Therefore, a capacitor in which a metal having a high work function such as titanium nitride (TiN) or platinum (Pt) may be used as an electrode instead of the polycrystalline silicon electrode.

For example, in the capacitor that uses $Al_2O_3$ or $HfO_2$ as a capacitor dielectric layer, a polysilicon layer may be used as a lower electrode, and a metal layer may be used as an upper electrode. This is referred to as a metal-insulator-silicon (MIS) structure or metal-insulator-metal (MIM) structure. At this time, the $Al_2O_3$ or $HfO_2$ dielectric layer of the capacitor may be formed using a chemical vapor deposition (CVD) method. Since carbon or hydrogen contained inside a precursor may remain, a subsequent thermal annealing process is necessary.

Furthermore, a double-layered structure such as TiN/poly-Si may be used for an upper electrode of a capacitor in order to minimize stress during a subsequent process when a metal layer composed of titanium nitride having a high work function is used.

When polycrystalline silicon is employed as an upper electrode on the hafnium oxide layer in the conventional semiconductor device as described above, a low-k dielectric material, that is, a silicon oxide layer, may be formed between the dielectric layer of the capacitor and the upper electrode of the capacitor by the reaction of the polycrystalline silicon and oxygen. A metal layer such as a titanium nitride layer may be further formed to prevent the reaction of the dielectric layer and the polycrystalline silicon.

Therefore, in the conventional method of fabricating a capacitor, the titanium nitride layer is formed on the high dielectric constant hafnium oxide layer, and a polysilicon layer doped with conductive impurities is formed on the titanium nitride layer, thereby forming an upper electrode.

Herein, the titanium nitride layer may be formed with a CVD process that uses titanium chloride ($TiCl_4$) gas and ammonia ($NH_3$) gas as reactant gases, as disclosed in U.S. Pat. No. 6,207,557.

First, a first titanium nitride layer is formed to a thickness of about 10 to 100 Å by a CVD method using titanium chloride ($TiCl_4$) gas and ammonia ($NH_3$) gas as reactant gases at a temperature of about 530 to 680° C. At this time, a degree of vacuum is maintained with about 0.2 to 0.5 torr, and a flow ratio of the ammonia ($NH_3$) gas to the titanium chloride ($TiCl_4$) gas is in the range of about 0.02 to 0.05.

Then, the first titanium nitride layer is thermally annealed for a predetermined time in an atmosphere of ammonia ($NH_3$) gas, thereby forming a protecting titanium nitride layer on the surface or grain boundary of the first titanium nitride layer. The ammonia ($NH_3$) gas flowed on the first titanium nitride layer is supplied at a flow rate of about 1000 sccm (standard cubic centimeters per minute) at a temperature of about 530 to 680° C. and with a degree of vacuum of about 3 torr.

A second titanium nitride layer is formed on the protecting titanium nitride layer by the same operations as forming the first titanium nitride layer. Herein, the second titanium nitride layer may be formed to a predetermined thickness by a CVD method using titanium chloride ($TiCl_4$) gas and ammonia ($NH_3$) gas as reactant gases at a temperature of about 530 to 680° C. At this time, a degree of vacuum is maintained at about 0.2 to 0.5 torr, and a flow ratio of the ammonia ($NH_3$) gas and the titanium chloride ($TiCl_4$) gas is in the range of about 0.02 to 0.05 sccm.

Therefore, the conventional method of fabricating the capacitor can prevent chlorine during the formation of the second titanium nitride layer from penetrating into the first titanium nitride layer by forming the protecting titanium nitride layer on the first titanium nitride layer.

However, in the conventional method of fabricating the capacitor described above, during formation of the first titanium nitride layer the titanium chloride source gas may react with the surface of the hafnium oxide layer at a high temperature to produce hafnium chloride. This may lower the performance of the resulting capacitor, thereby resulting in a decreased production yield.

Embodiments of the invention address these and other disadvantages of the conventional art.

SUMMARY

Embodiments of the invention provide methods of forming a titanium nitride layer that suppress the generation of hafnium chloride on a surface of a hafnium oxide layer, and methods of fabricating a storage capacitor having the titanium nitride layer.

DETAILED DESCRIPTION

The teachings of the invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout.

FIGS. 1a through 1k are sectional diagrams illustrating a method of fabricating a capacitor of a semiconductor device according to some embodiments of the invention. For purposes of illustration, the semiconductor device will be assumed to be a DRAM device, although other types of semiconductor devices could be fabricated.

Figure 1A:
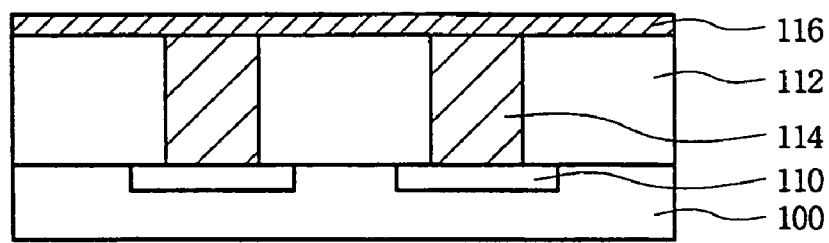
FIGS. 1A through 1K are sectional diagrams illustrating a method of fabricating a capacitor of a semiconductor device according to some embodiments of the invention.

Referring to FIG. 1A, an etch stop layer 116 is formed on a semiconductor substrate 100 having an interlayer insulating layer 112 and a conductive structure 114. The etch stop layer 116 may be composed of silicon nitride. The conductive structure 114 may be a contact plug that is electrically connected to a capacitor node contact region 110 of the semiconductor substrate 100. The interlayer insulating layer 112 is formed to selectively expose the contact plug. The etch stop layer 116 is a predetermined thickness (for example, about 100 to 1000 Å) and is composed of a material having a high selectivity with respect to the interlayer insulating layer 112.

Figure 1B:
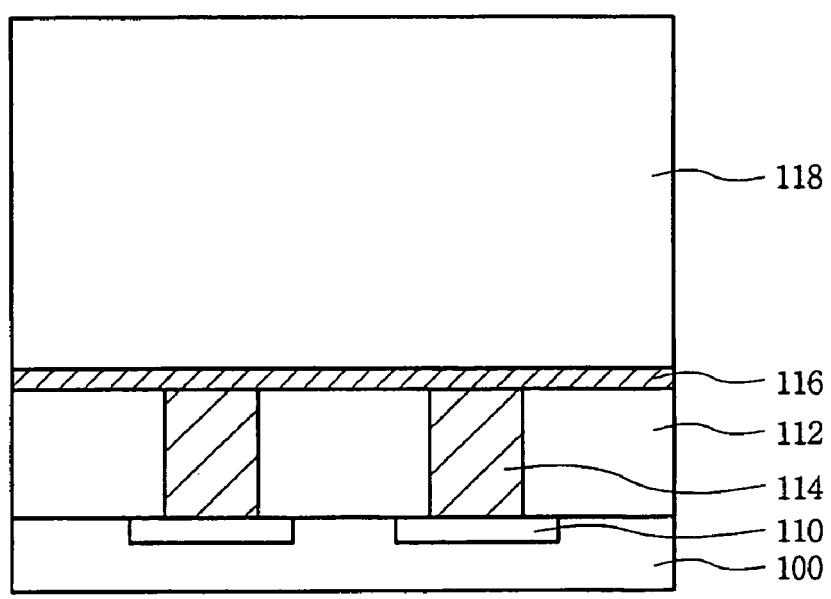

Although not shown in the drawings, source/drain regions and a pad contact that is electrically connected to the conductive structure 114 may also be formed. Referring to FIG. 1B, a mold layer 118 is formed on the semiconductor substrate 100 having the etch stop layer 116. The mold layer 118 may be composed of silicon oxide, which is formed by heating mixed reactant gases such as a silicon compound (for example, monosilane) and oxygen and flowing on the semiconductor substrate 100 loaded inside a chamber using a CVD technique.

Alternatively, mixed reactant gases containing nitrogen, such as nitrogen oxide (NO), nitrous oxide ($N_2O$), or ammonia ($NH_3$) may be periodically supplied into the chamber, causing the mold layer 118 to have a multi-layered structure that includes a silicon oxide layer and a silicon oxynitride layer. Furthermore, the mold layer 118 may have a thickness greater than or at least equal to a height (for example, about 7000 to 18000 Å) of a storage electrode that is formed in a subsequent process.

Figure 1C:
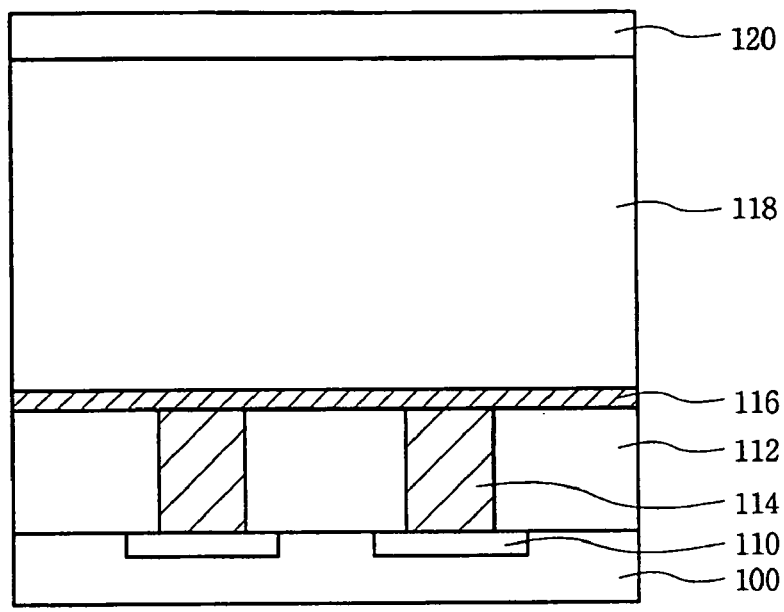

Referring to FIG. 1C, a hard mask layer 120 is formed on the mold layer 118. The hard mask layer 120 may be composed of silicon nitride. When the mold layer 118 and the hard mask layer 120 are formed in-situ, that is, inside one process chamber, foreign substances are prevented from forming between the mold layer 118 and the hard mask layer 120, and process efficiency is improved.

Figure 1D:
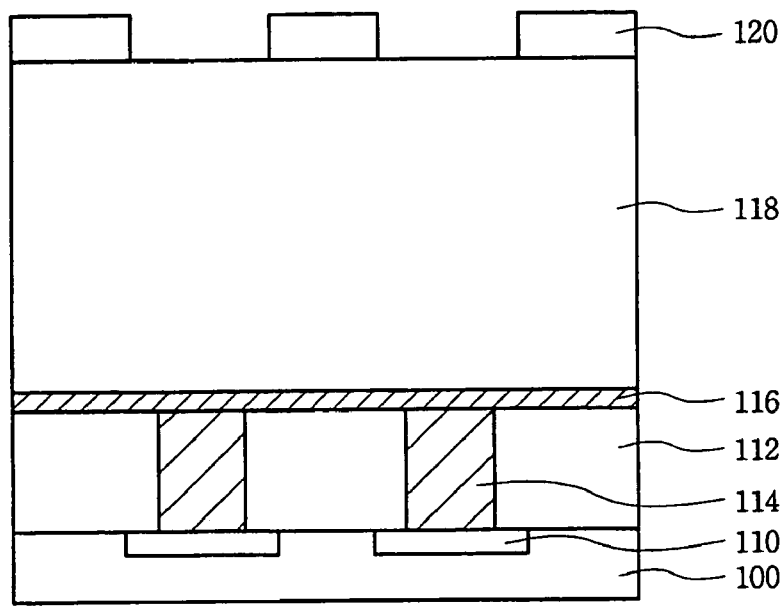

Referring to FIG. 1D, an upper portion of the hard mask layer 120 is coated with photoresist (not shown), and the photoresist is patterned to expose a portion of the hard mask layer 120. Using the photoresist as an etch mask, a portion of the hard mask layer 120 is removed to expose the mold layer 118.

Figure 1E:
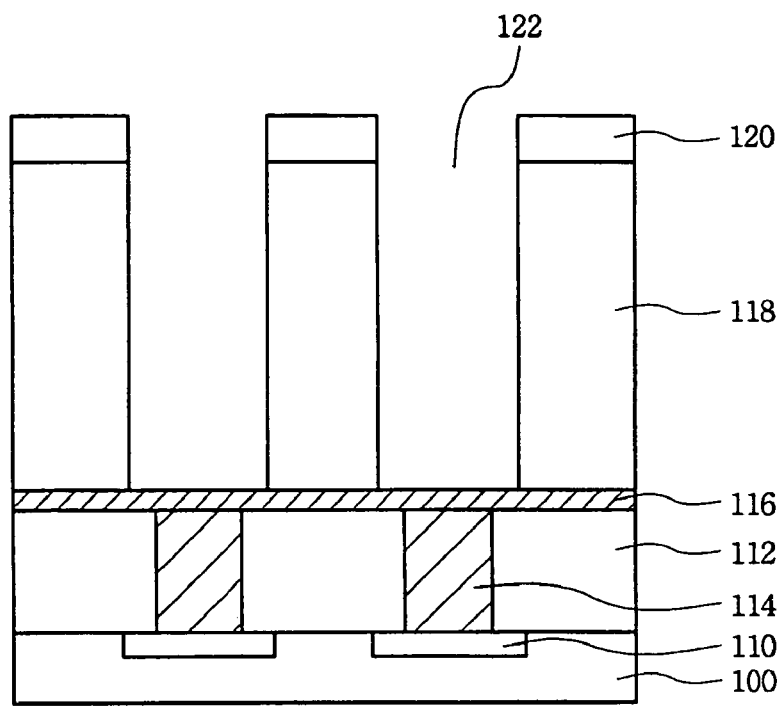

Referring to FIG. 1E, using the photoresist and the hard mask layer 120 as etch masks, the mold layer 118 is removed to expose a portion of the etch stop layer 116, thereby forming a trench 122. The trench 122 may be formed using a dry etch technique, which provides excellent vertical characteristics. During the etch process, as an etch rate toward the lower portion of the trench 122 decreases in comparison with the entrance of the trench, the sidewalls of the trench may be formed with a predetermined slope such that the lower portion of the trench becomes narrower than the entrance of the trench. Furthermore, when the mold layer 118 has a multi-layered structure, the mold layer may be etched using an anisotropic etch solution (for example, HF or sulfuric acid) or an anisotropic reactant gas such that the sidewalls of the trench 122 are roughened, thereby increasing the surface area of the trench 122.

Figure 1F:
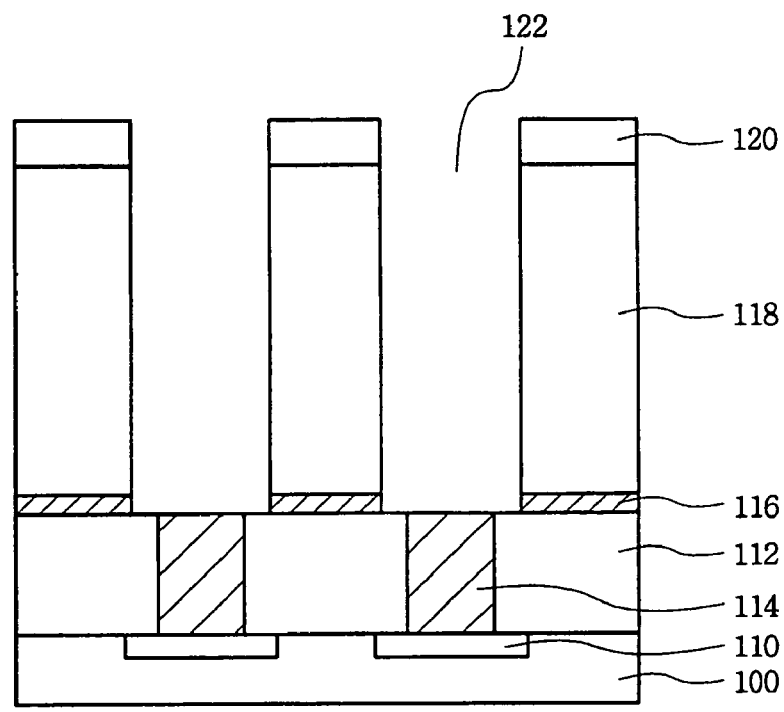

Referring to FIG. 1F, the etch stop layer 116 exposed by the mold layer 118 and the hard mask layer 120 is removed, exposing the conductive structure 114. Then, the etch stop layer 116 can be removed using a dry etch method in-situ during the removal of the mold layer 118. At this time, when using an anisotropic etch solution or an anisotropic reactant gas that provides a high etch selectivity relative to the mold layer 118, the etch stop layer 116 and the interlayer insulating layer 112 below the etch stop layer 116 can be excessively etched to expose a portion of the conductive structure 114. Furthermore, the hard mask layer 120 may be removed concurrently with the etch stop layer 116.

Figure 1G:
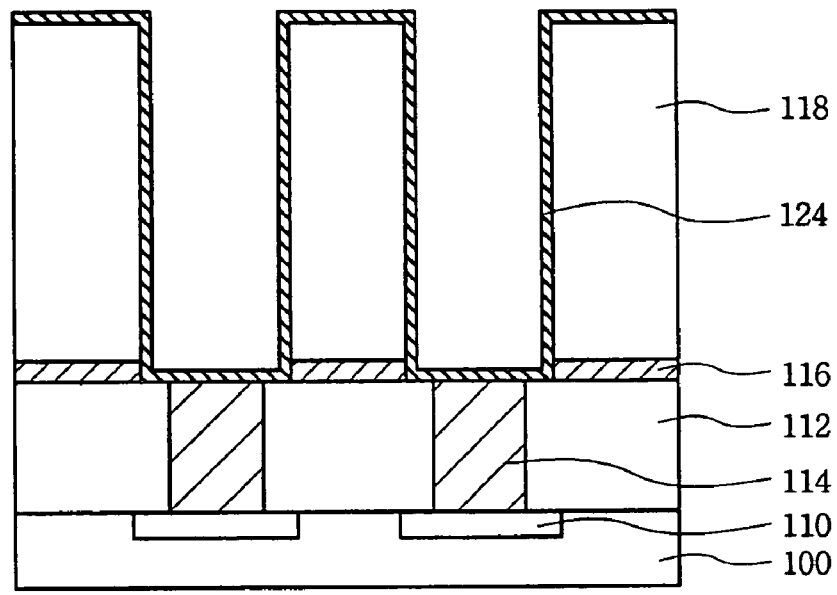

Referring to FIG. 1G, a storage electrode 124 is formed on the resulting surface of the semiconductor substrate 100 having the trench 122, using polysilicon doped with conductive impurities. At this time, the conductivity of the polysilicon may be increased by increasing the concentration of the conductive impurities.

Figure 1H:
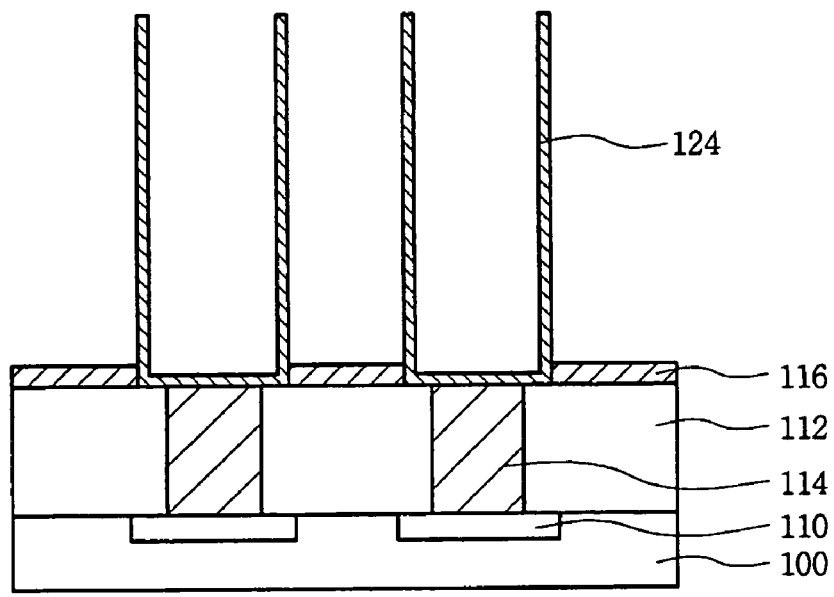

Referring to FIG. 1H, a sacrificial layer (not shown) of silicon oxide, silicon oxynitride, etc., is formed on the storage electrode 124 to bury the trench 122. A chemical mechanical polishing (CMP) or an etch-back process is performed on the sacrificial layer and on the storage electrode 124, to expose a portion of the mold layer 118 and to separate the storage electrode 124. Even though not shown, a hemispherical grain (HSG) layer may be formed on the overall surface of the polysilicon in order to increase the surface area of the storage electrode 124. Here, the storage electrode 124 has an overall cylindrical shape with an empty inner space. Furthermore, the sacrificial layer formed inside the cylinder prevents slurry used during the CMP process from damaging the above structure, which may otherwise occur during the node separation process.

Figure 1I:
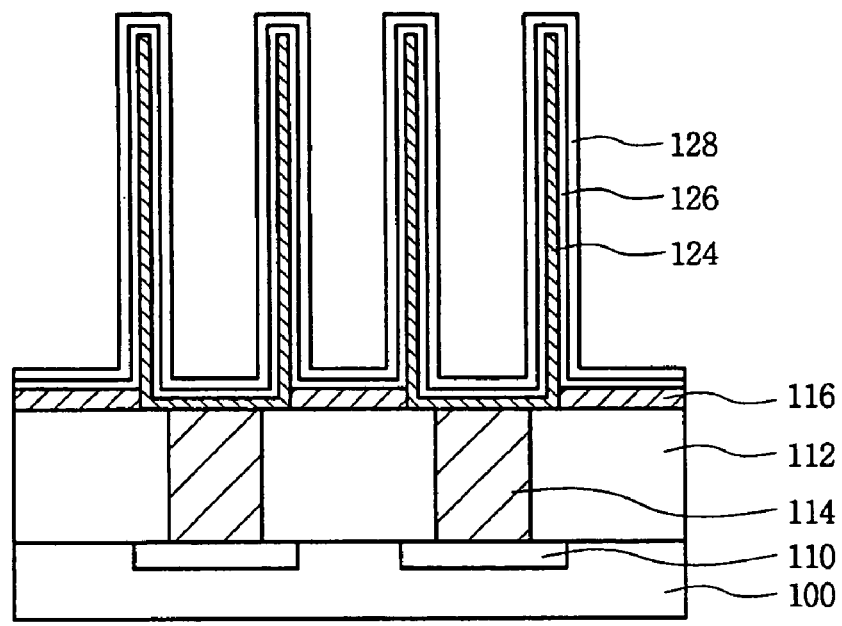

Referring to FIG. 1I, a first dielectric layer 126 and a second dielectric layer 128 are sequentially formed on the storage electrode 124. The first dielectric layer 126 may be formed of alumina ($Al_2O_3$), and the second dielectric layer 128 may be formed of hafnium oxide ($HfO_2$). The alumina and the hafnium oxide layer are used as the composite dielectrics, and may be formed using a chemical vapor deposition (CVD) method or an atomic layer deposition (ALD) method such as metal-organic chemical vapor deposition (MOCVD). The alumina has a dielectric constant of about 12, and the hafnium oxide has a dielectric constant of about 28. The first dielectric layer 126 may be composed of a dielectric material other than alumina, for example, $Ta_2O_5$, $SrTiO_3$, $(Ba, Sr)TiO_3$, $Pb(Zr, Ti)O_3$, $(Pb, La)(Zr, Ti)O_3$, $TiO_2$, or the like.

The first dielectric layer 126 may be formed to a thickness of about 14 to 28 Å, and the second dielectric layer 128 may be formed to a thickness of about 30 to 40 Å. If the second dielectric layer 128 were formed directly on the storage electrode 124, the interface characteristics between the polysilicon layer of the storage electrode 124 and second dielectric layer 128 would deteriorate, but here the first dielectric layer 126 is used as a buffer layer to provide excellent interface characteristics with both the polysilicon layer of the storage electrode 124 and the second dielectric layer 128.

Figure 1J:
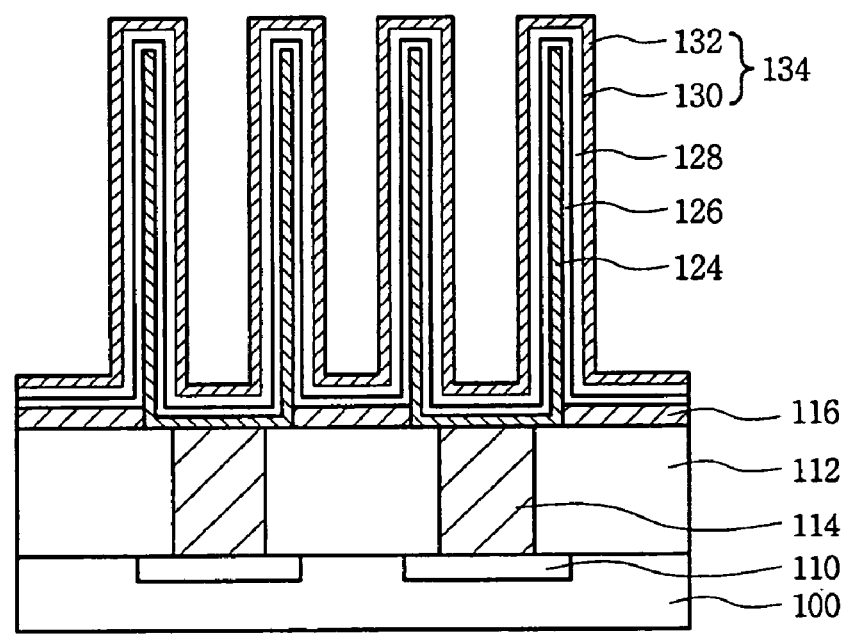

Referring to FIG. 1J, a titanium nitride layer 134 is formed on the second dielectric layer 128, using either a CVD process or an ALD process.

When the CVD process is used, titanium chloride ($TiCl_4$) gas and ammonia ($NH_3$) gas are supplied with a predetermined flow rate, thereby forming a first titanium nitride layer 130 on the second dielectric layer 128. Furthermore, before supplying the titanium chloride gas and the ammonia gas into the chamber, the titanium chloride gas alone may be supplied into the chamber for several seconds (for example, about one second), and the titanium chloride gas may be supplied on the second dielectric layer 128, thereby exposing the bottom and the sidewalls of the trench 122 to the titanium chloride gas.

For example, the titanium chloride gas and the ammonia gas are supplied into the chamber having the semiconductor substrate 100 at a temperature of about 450 to 500° C. in the vacuum state of a pressure of about 2.2 to 5 torr, at flow rates of about 30 sccm and 45 sccm, respectively, for about 4 to 10 seconds. Therefore, according to these embodiments of the invention, a first titanium nitride layer 130 may be formed by the reaction of the titanium chloride gas and the ammonia gas at a low temperature in comparison with a conventional case. A nitrogen gas may be supplied as a dilution gas into the chamber at a flow rate of about 300 sccm before or after forming the first titanium nitride layer 130. At this time, a partial pressure of the titanium chloride gas is in the range of about 0.176 to 0.4, and the first titanium nitride layer 130 formed by the titanium chloride gas and the ammonia gas can be deposited at a rate of about 5 Å/sec.

Then, after the first titanium nitride layer 130 is formed, the chlorine element inside the first titanium nitride layer 130 can be removed by selectively exposing the first titanium nitride layer 130 to only an ammonia gas. At this time, the temperature and the vacuum state of the chamber can be maintained with same or similar conditions as above, and the flow rate of the ammonia gas supplied to the chamber is also similar to that of the process of forming the first titanium nitride layer 130. For example, the ammonia gas is supplied into the chamber for several seconds (for example, about 5 seconds), and the nitrogen gas is also supplied at a same or similar flow rate as that of the process of forming the first titanium nitride layer 130.

Alternatively, when the ALD process is used to form the titanium nitride layer 134, a titanium chloride reactant gas is supplied into the chamber that has a predetermined temperature and vacuum state at a predetermined flow rate, the chamber is purged, and then an ammonia gas is supplied into the chamber at a predetermined flow rate. By repeatedly performing the above steps of sequentially supplying titanium chloride gas, purge gas, and ammonia gas, the first titanium nitride layer 130 may be formed to a desired thickness.

For example, the temperature of the chamber is as low as a temperature of about 450 to 500° C., and the degree of vacuum of the chamber is maintained as low as about 1 torr (0.7 pascal) to 5 torr. The titanium chloride gas and the ammonia gas are supplied into the chamber at a flow rate of the same as or similar to that of the process of forming the first titanium nitride layer 130. At this time, the titanium chloride gas supplied to the semiconductor substrate 100 is chemically adsorbed on the surface of the second dielectric layer 128, and the titanium chloride, which is not adsorbed on the surface of the second dielectric layer, can be detached therefrom during the purge process. Then, when an ammonia gas is supplied to the chamber, the titanium chloride and the ammonia react with each other so that the chlorine elements of the titanium chloride is replaced by the nitrogen, thereby forming a single atomic layer of the first titanium nitride layer 130 on the hafnium oxide layer. During the formation of the first titanium nitride layer 130, the chlorine replaced by the nitrogen reacts with hydrogen of the ammonia gas, thereby to form hydrochloride gas, which is exhausted from the chamber. Using the ALD process described above, the first titanium nitride layer 130 can be formed to a thickness of about 20 to 50 Å.

Table 1 illustrates, for several temperatures, the number of moles of hafnium chloride formed by the reaction of one mole of titanium chloride and one mole of hafnium oxide in a degree of vacuum of about 2.2 torr.

TABLE 1

| temperature | number of moles of ($HfCl_4$) for one mole of ($TiCl_4$) and ($HfO_2$) |
|---|---|
| 600° C. | $1(TiCl_4) + 1(HfO_2) = A(TiCl_4) + B(HfO_2) + 0.003373(HfCl_4)$ |
| 550° C. | $1(TiCl_4) + 1(HfO_2) = A(TiCl_4) + B(HfO_2) + 0.001987(HfCl_4)$ |
| 500° C. | $1(TiCl_4) + 1(HfO_2) = A(TiCl_4) + B(HfO_2) + 0.001075(HfCl_4)$ |
| 450° C. | $1(TiCl_4) + 1(HfO_2) = A(TiCl_4) + B(HfO_2) + 0.000524(HfCl_4)$ |

In Table 1, the number of moles of unreacted titanium chloride and hafnium oxide is not specified. Here, in the case of forming the first titanium nitride layer 130 at a temperature of 600° C., about 0.003 mole of hafnium chloride is generated between the first titanium nitride layer 130 and the hafnium oxide layer, but in the case of forming the first titanium nitride layer 130 at a temperature of 450° C., about 0.0005 mole of hafnium chloride is generated between the first titanium nitride layer 130 and the hafnium oxide layer. In other words, when the titanium nitride layer is formed on the second dielectric layer 128 (hafnium oxide layer) using lower temperatures, the amount of hafnium chloride produced is reduced compared to when higher temperatures are used.

Because the titanium nitride layer 130 is formed on the hafnium oxide layer at a lower temperature than in the conventional methods, less hafnium chloride is produced, which improves the performance of the resulting capacitor.

Furthermore, after the first titanium nitride layer is formed, the supply of titanium chloride gas and ammonia gas into the chamber is stopped. Then, the inside of the chamber is purged, and an inner temperature of the chamber is increased up to about 600° C. In the low temperature process, because it takes a certain amount of time to stably increase the temperature of the chamber having the first titanium nitride layer 130 up to a high temperature, the semiconductor substrate 100 can be moved to perform a subsequent process from one side of the cluster type low temperature chamber, in which the first titanium nitride layer is formed on the semiconductor substrate 100, to the other side of a high temperature chamber.

Next, titanium chloride ($TiCl_4$) gas and ammonia ($NH_3$) gas are supplied on the semiconductor substrate 100 having the first titanium nitride layer 130 at predetermined flow rates to form a second titanium nitride layer 132 on the hafnium oxide layer using a CVD process. For example, the chamber receiving the semiconductor substrate 100 has a temperature of about 600° C. or more, and a pressure of about 2.2 to 5 torr. The titanium chloride gas and the ammonia gas are supplied at flow rates of about 30 sccm and about 45 sccm respectively for about 40 to 46 seconds. At this time, nitrogen gas is also supplied into the chamber as a dilution gas at a flow rate of about 300 sccm. The second titanium nitride layer 132 may be formed by deposition from the titanium chloride gas and the ammonia gas at a rate of about 5 Å/sec and to a thickness of about 200 to 230 Å.

Figure 3:
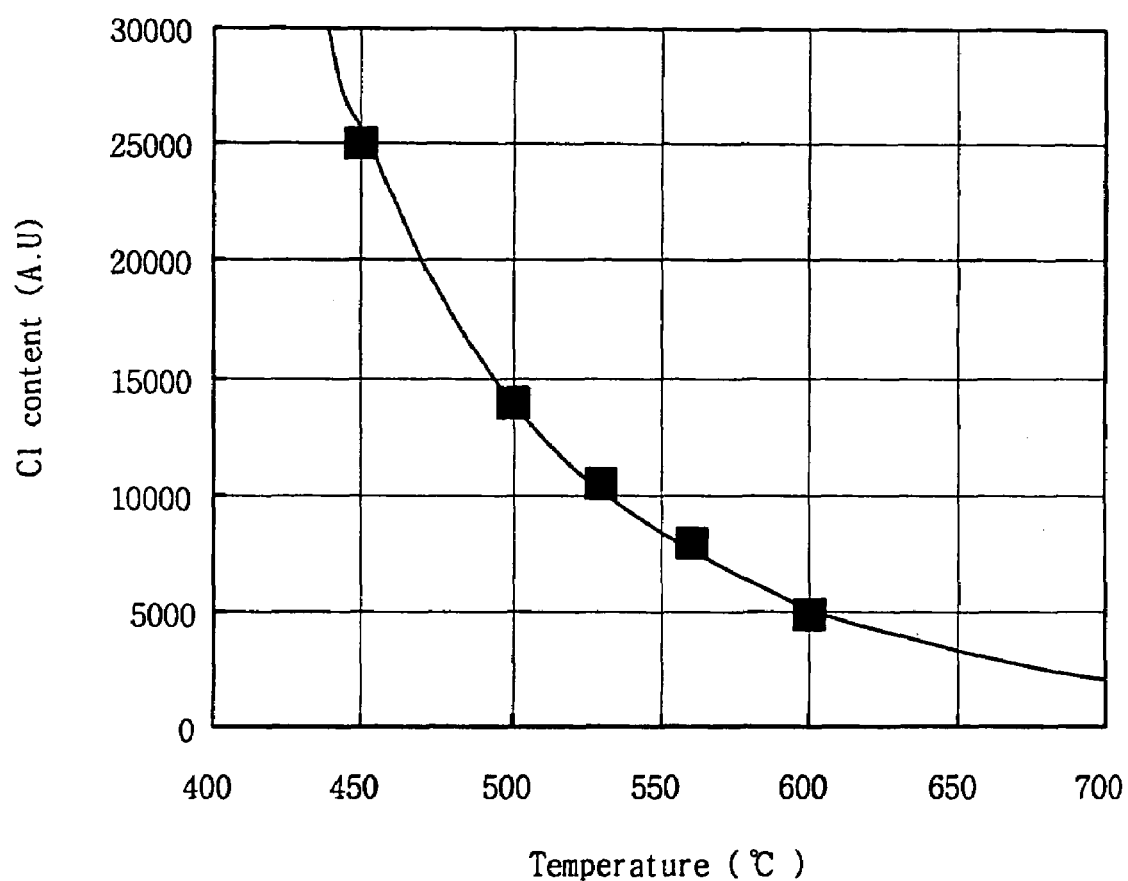
FIG. 3 is a graph illustrating the amount of chlorine present in the titanium nitride layer as a function of temperature.

In the meantime, the titanium nitride layer formed by the CVD method contains chlorine from the titanium chloride gas that was supplied as a source gas. FIG. 3 is a graph illustrating the amount of chlorine present in the titanium nitride layer as a function of temperature. As shown in FIG. 3, the amount of chlorine inside the titanium nitride layer is reduced as the temperature increases.

Thus, even though the first titanium nitride layer 130 formed by the low temperature CVD or ALD method contains a greater amount of chlorine, the chlorine inside the first titanium nitride layer 130 may be removed during the high temperature CVD process that results in the formation of the second titanium nitride layer 132.

According to these embodiments of the invention, the first titanium nitride layer 130 formed on the hafnium oxide layer by the low temperature CVD or ALD process prevents chlorine from damaging the surface of the hafnium oxide layer. Since the second titanium nitride layer 132 is formed on the first titanium nitride layer 130 by a high temperature CVD process, the chlorine content of both the first and second titanium nitride layers 130, 132 is reduced, improving the performance of the capacitor.

Figure 1K:
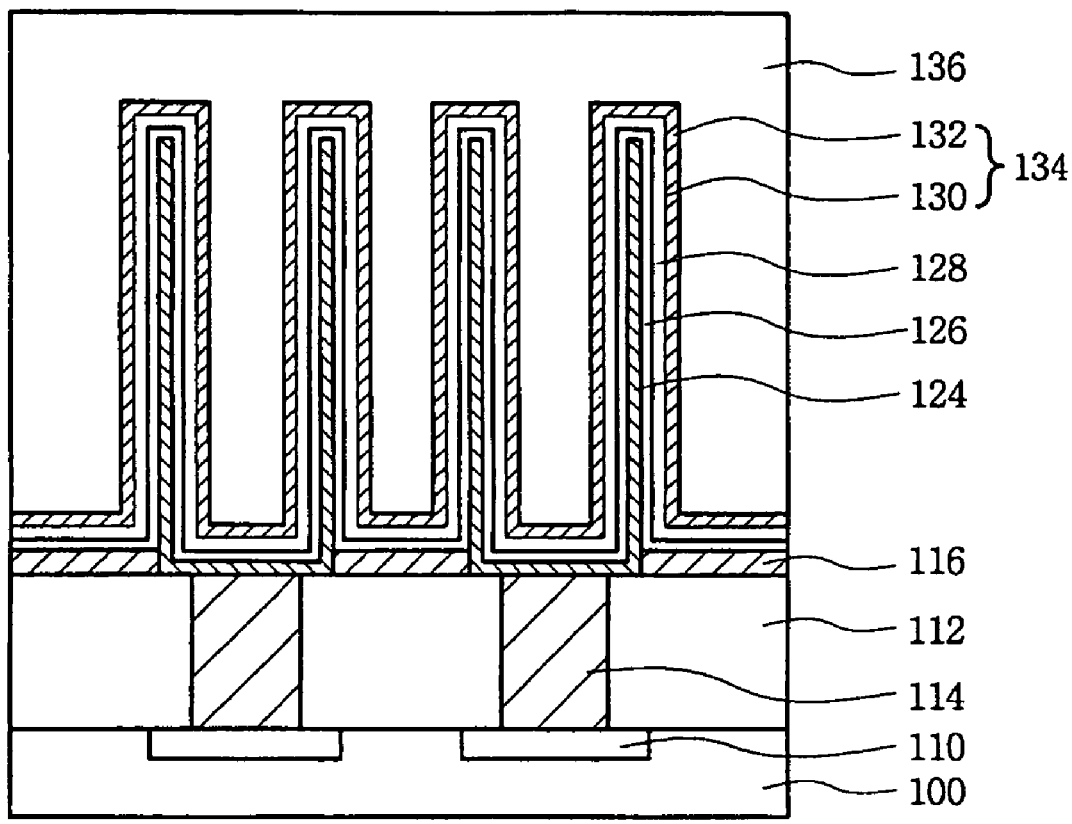

Referring to FIG. 1K, a polysilicon layer 136 doped with conductive impurities is formed on the semiconductor substrate 100 having the first and second titanium nitride layers 130, 132 using a CVD process, thereby completing the fabrication process of the capacitor. Here, the first and second titanium nitride layers 130, 132 and the polysilicon layer 136 may be used as an upper electrode (for example, referred to as a plate electrode).

Even though not shown, an additional interlayer insulating layer can be further formed on the polysilicon layer.

As explained above, these embodiments of the invention improve the performance of the capacitor and increase or optimize a production yield by reducing the damage of the hafnium oxide layer due to the initial low temperature process and by reducing the content of the chlorine inside the first and second titanium nitride layer 132.

FIGS. 2A through 2L are sectional diagrams illustrating a method of fabricating a capacitor of a semiconductor device according to some other embodiments of the invention.

Figure 2A:
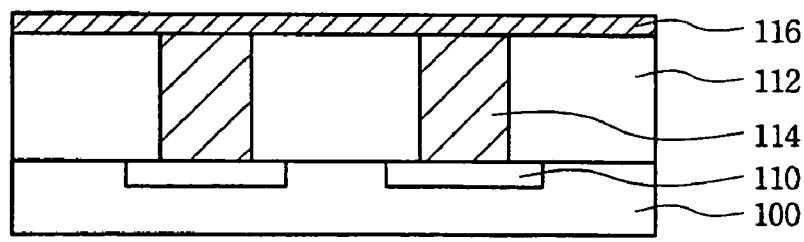
FIGS. 2A through 2L are sectional diagrams illustrating a method of fabricating a capacitor of a semiconductor device according to some other embodiments of the invention.

Referring to FIG. 2A, an etch stop layer 116 is formed on a semiconductor substrate 100 having an interlayer insulating layer 112 and a conductive structure 114. The etch stop layer 116 may be composed of silicon nitride. Here, the conductive structure 114 is a contact plug that is electrically connected to a capacitor node contact region 110 of the semiconductor substrate 100. The interlayer insulating layer 112 is formed to selectively expose the contact plug. The etch stop layer 116 may be formed to a predetermined thickness (e.g., about 100 to 1000 Å) using a material having a high selectivity with respect to the interlayer insulating layer 112.

Although not shown, source/drain regions and a pad contact electrically connected to the conductive structure 114 may be formed.

Figure 2B:
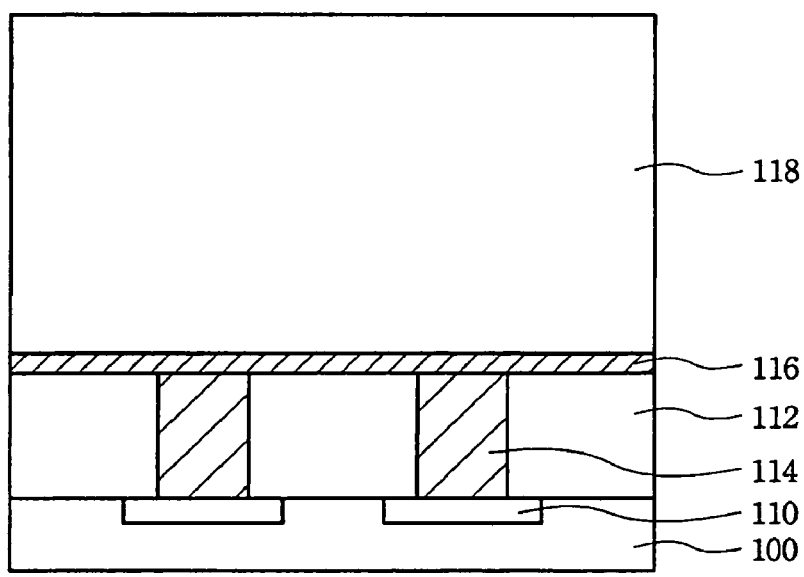

Referring to FIG. 2B, a mold layer 118 is formed on the etch stop layer 116. The mold layer 118 may be composed of silicon oxide. In this case, the silicon oxide mold layer 118 may be formed using a CVD method, by heating mixed reactant gases such as silicon compound (for example, monosilane) and oxygen and flowing on the semiconductor substrate 100 loaded inside a process chamber.

Although not shown, nitrogen compounds such as nitrogen oxide (NO), nitrous oxide ($N_2O$), or ammonia ($NH_3$) may be periodically supplied into the process chamber with the mixed reactant gases, thereby forming the mold layer 118 having a multi-layered structure that includes a silicon oxide layer and a silicon oxynitride layer. Further, the mold layer 118 may have a thickness at least greater than or equal to the magnitude of the height (for example, about 7000 to 18000 Å) of a storage electrode 124 that is formed later.

Figure 2C:
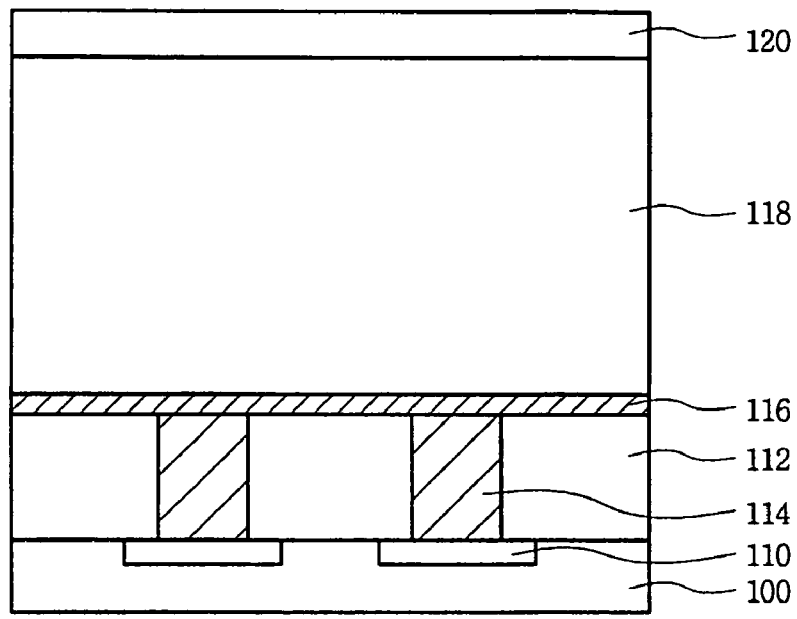

Referring to FIG. 2C, a hard mask layer 120 is formed on the mold layer 118. The hard mask layer 120 may be composed of silicon nitride. At this time, the mold layer 118 and the hard mask layer 120 can be formed in-situ inside one process chamber, improving a process efficiency and preventing foreign particles from being formed between the mold layer 118 and the hard mask layer 120.

Figure 2D:
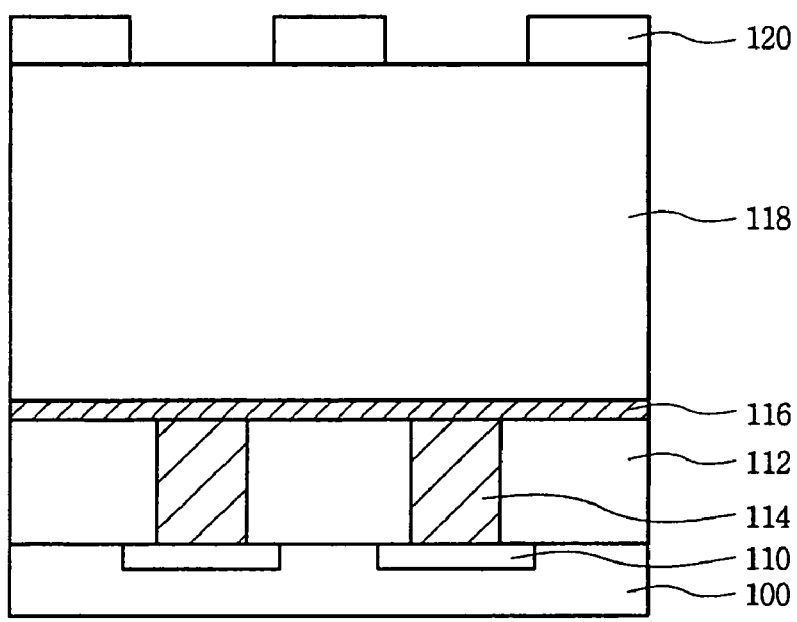

Referring to FIG. 2D, photoresist (not shown) is deposited on the hard mask layer 120, and the photoresist is patterned to expose a portion of the hard mask layer 120 on the conductive structure 114. Using the photoresist as an etch mask, a portion of the hard mask layer 120 is removed to expose the mold layer 118.

Figure 2E:
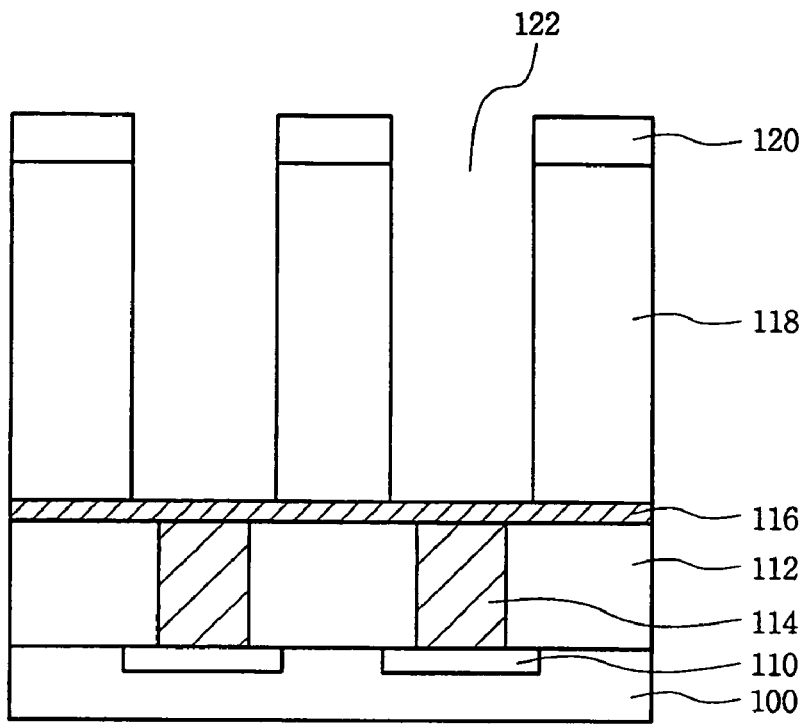

Referring to FIG. 2E, using the photoresist and the hard mask layer 120 as etch masks, the mold layer 118 is removed to expose a portion of the etch stop layer 116, thereby forming a trench 122. The trench 122 may be formed with dry etching methods, which provide excellent vertical characteristics. Alternatively, the trench 122 may be formed to have a sidewall of a predetermined slope, with a wide upper portion of the trench tapering down to a narrower lower portion. This is possible because when the etch process is performed on the mold layer 118, the etch rate may be reduced as the depth of the trench increases. Furthermore, when the mold layer 118 is formed of a multi-layered structure, the multi-layered mold layer 118 is etched using an anisotropic etch solution (for example, HF or sulfuric acid) or an anisotropic etch gas to provide curves on the sidewalls of the trench 122, so as to widen the surface area inside the trench 122.

Figure 2F:
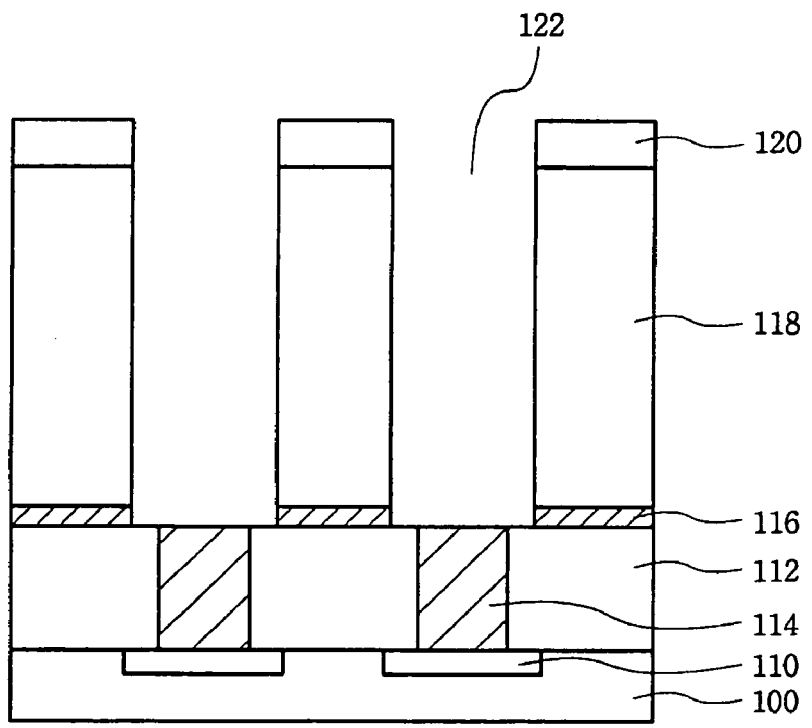

Referring to FIG. 2F, the etch stop layer 116 that is exposed by the mold layer 118 and the hard mask layer 120 is removed to expose the conductive structure 114. Here, the process of removing the etch stop layer 116 may be performed in-situ during the removal of the mold layer 118 by the dry etch method. Using the etch solution or the reactant gas that has a high etch selectivity with respect to the mold layer 118, the etch stop layer 116, and the interlayer insulating layer 112 below the etch stop layer 116 are excessively etched so as to expose a portion of the conductive structure 114. The hard mask layer 120 may be removed together with the etch stop layer 116.

Figure 2G:
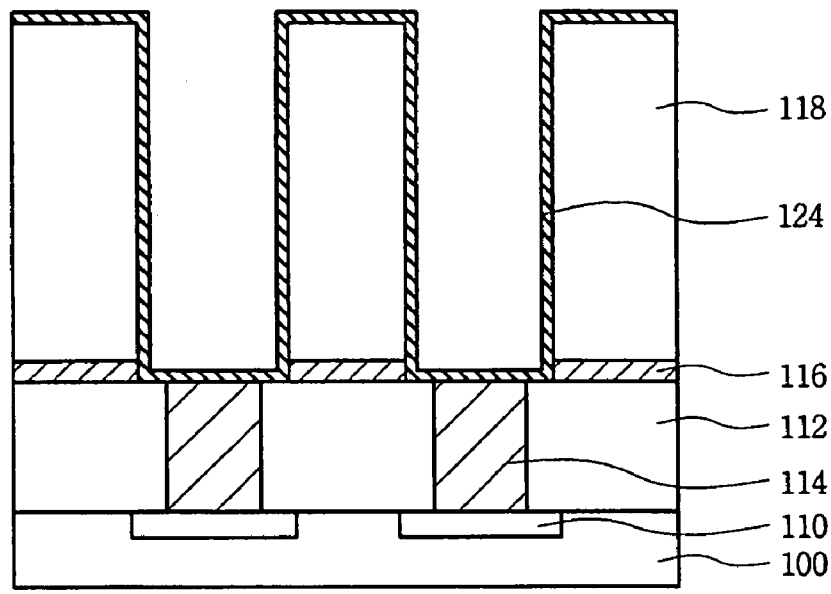

Referring to FIG. 2G, a storage electrode 124 is formed on the overall surface of the semiconductor substrate 100 including the trench 122, the storage electrode composed of polysilicon doped with conductive impurities. The conductivity of the polysilicon may be increased by increasing the concentration of the conductive impurities.

Figure 2H:
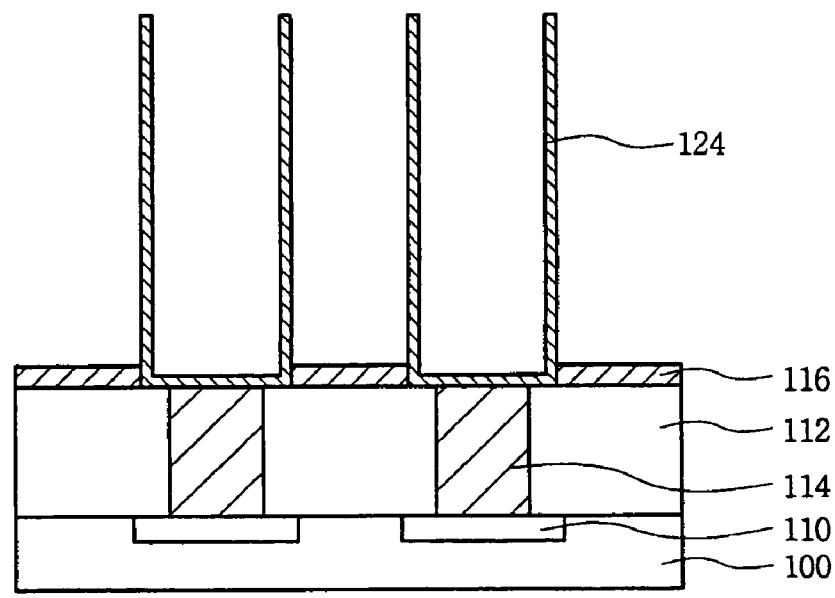

Referring to FIG. 2H, a sacrificial layer (not shown) is formed on the storage electrode 124 to bury the trench 122. The sacrificial layer may be composed of a silicon oxide layer, a silicon oxynitride layer, or the like. A portion of the mold layer 118 is exposed, and a chemical mechanical polishing (CMP) or etch-back process is performed on the storage electrode 124 to separate nodes of the storage electrode 124. Even though not shown, a hemispherical grain (HSG) layer may be formed on the overall surface of the polysilicon in order to increase the surface area of the storage electrode 124. Here, the storage electrode 124 has a cylindrical shape having an empty space within. The sacrificial layer formed inside the cylinder may prevent the slurry from damaging the structure during the separation of the nodes in the CMP process. Next, the mold layer 118 and the sacrificial layer are removed.

Figure 2I:
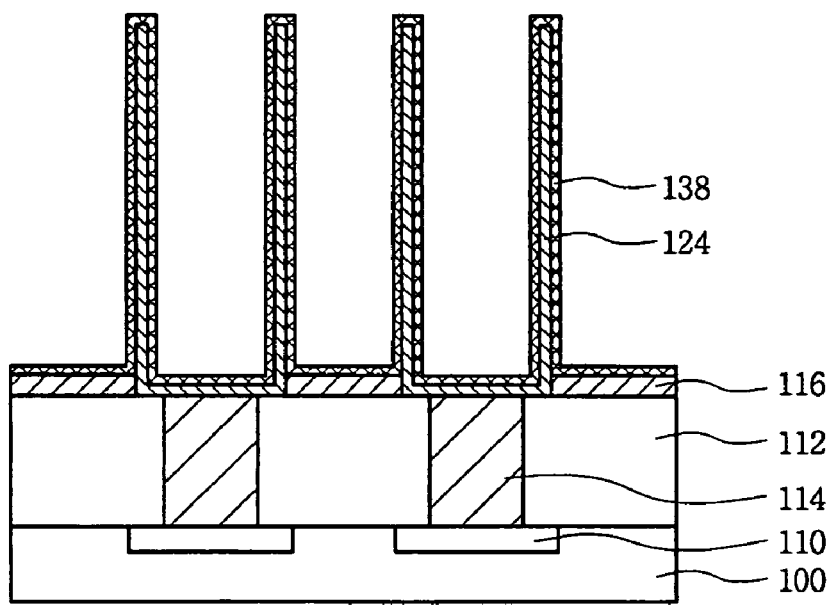

Referring to FIG. 2I, a lower metal layer 138 may be formed on the storage electrode 124 using a sputtering process, a CVD process, or an ALD process. The lower metal layer 138 may be composed of Cu, Al, Ti, Ta, TiN, TaN, TaSiN, TiSiN, WN, or WSiN. A CVD process or an ALD process is little affected by temperature and provides an excellent step coverage in comparison with the sputtering method because the lower metal layer 138 is formed on the storage electrode 124, which is formed on the semiconductor substrate 100 in a vertical shape. Furthermore, a thermal annealing process may be performed on the lower metal layer 138 to minimize the chlorine content inside the lower metal layer 138.

Figure 2J:
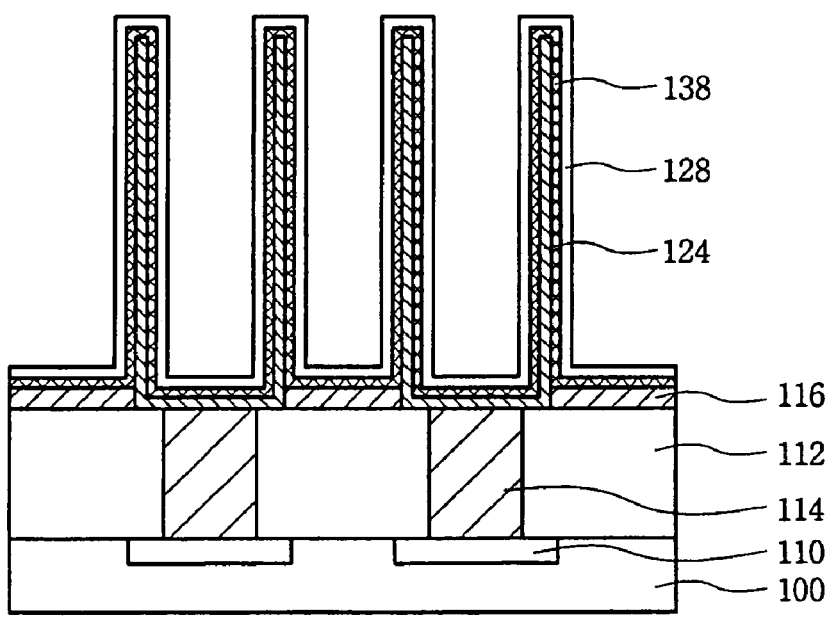

Referring to FIG. 2J, a second dielectric layer 128 is formed on the lower metal layer 138. The second dielectric layer 128 may be composed of hafnium oxide, and may be formed with a CVD process or an ALD process. The second dielectric layer 128 may be formed to a thickness of about 30 to 50 Å.

Therefore, according to these embodiments, the second dielectric layer 128 may be formed to a thickness that is less than what was described with regard to FIGS. 1A-1K, since the hafnium oxide layer can be formed as a single dielectric layer on the lower metal layer 138.

Figure 2K:
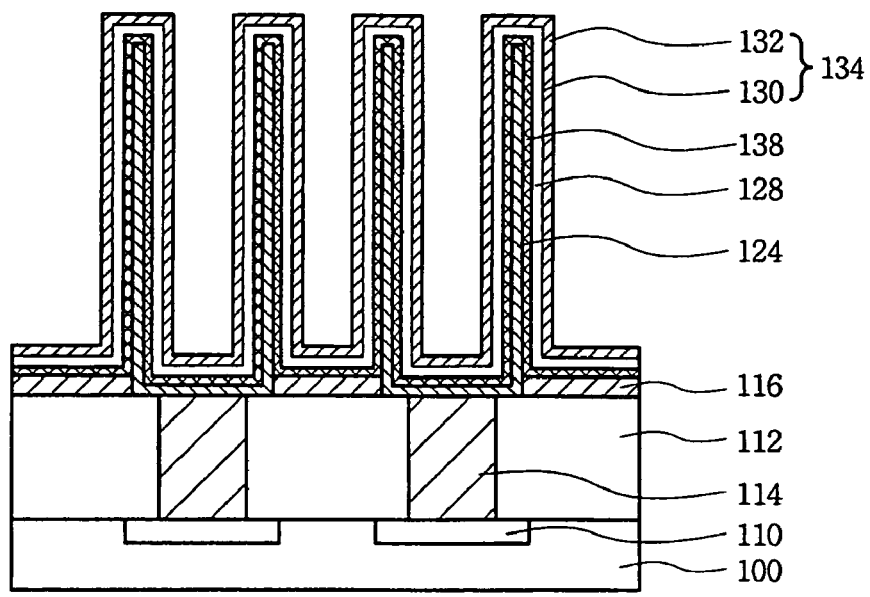

Referring to FIG. 2K, a titanium nitride layer 134 may be formed on the second dielectric layer 128 using a CVD process or an ALD process.

When the titanium nitride layer 134 is formed with the CVD process, titanium chloride ($TiCl_4$) gas and ammonia ($NH_3$) gas are supplied on the semiconductor substrate 100 having the second dielectric layer 128, thereby forming a first titanium nitride layer 130 on the second dielectric layer. Furthermore, before the titanium chloride ($TiCl_4$) gas and the ammonia ($NH_3$) gas are supplied into the chamber, the titanium chloride ($TiCl_4$) gas alone may be supplied into the chamber for several seconds (for example, about 1 second) at a low temperature, and by flowing the titanium chloride gas on the second dielectric layer 128, bottom and sidewall surfaces of the trench 122 are exposed to the titanium chloride.

For example, the titanium chloride gas and the ammonia gas may be supplied into the chamber at flow rates of about 30 sccm and about 45 sccm, respectively, for about 4 to 10 seconds. The chamber has the semiconductor substrate 100 loaded therein, is at a temperature of about 450 to 500° C., and at a pressure of about 2.2 to 5 torr. Therefore, the first titanium nitride layer 130 may be formed by the reaction of the titanium chloride gas and the ammonia gas at a lower temperature than that of the conventional method.

As a dilution gas, a nitrogen gas may be supplied into the chamber at a flow rate of about 300 sccm before or after the first titanium nitride layer 130 is formed. At this time, a partial pressure of the titanium chloride gas is about 0.176 to 0.4, and the first titanium nitride layer 130 formed by the reaction of the titanium chloride gas and the ammonia gas may be formed at a rate of about 5 Å/sec.

Next, when the formation of the first titanium chloride layer 130 is completed, the first titanium nitride layer 130 may be exposed only to the ammonia gas, so as to remove the chlorine inside the first titanium nitride layer 130. At this time, the temperature and the degree of vacuum can be maintained with same or similar conditions, and a flow rate of the ammonia gas flowed inside the chamber is also maintained the same as or similar to the conditions of forming the first titanium nitride layer 130. For example, the ammonia gas is supplied into the chamber for several seconds (for example, about 5 seconds), and the nitrogen gas can be also supplied at a flow rate equal to or similar to the condition of forming the titanium nitride layer 130.

When the titanium nitride layer 134 is formed using the ALD process, a predetermined amount of titanium chloride reactant gas is flowed inside the chamber that is maintained at a predetermined temperature and degree of vacuum, and then purged. Then, a predetermined amount of ammonia gas is flowed inside the chamber, and then purged.

Through the repetition of the above operations, purge gas, titanium chloride gas, and ammonia gas may be sequentially and repeatedly supplied to form the first titanium nitride layer 130.

For example, the temperature of the chamber is maintained a low temperature of about 450 to 500° C., and the degree of vacuum thereof is maintained a low pressure of about 1 torr (about 0.7 pascal) to 5 torr. The titanium chloride gas and the ammonia gas are supplied into the chamber at flow rates respectively equal to or similar to those of the case of forming the first titanium nitride layer 130. At this time, the titanium chloride gas flowed on the semiconductor substrate 100 is chemically adsorbed on a surface of the hafnium oxide layer 128, and the titanium chloride, which is not adsorbed on the surface of the hafnium oxide layer, is taken out during a purge operation. Then, the ammonia gas is supplied into the chamber, and the titanium chloride and the ammonia react with each other. The chlorine of the titanium chloride is replaced by nitrogen, and the first titanium nitride layer 130 as one single atomic layer is formed on the hafnium oxide layer 128. The chlorine replaced by the nitrogen during the formation of the first titanium nitride layer 130 and the hydrogen of the ammonia react with each other, and are exhausted out of the chamber as hydrochloric acid gas. By the ALD method, the first titanium nitride layer 130 is formed with a thickness of about 20 to 50 Å. As was illustrated above in Table 1, when the titanium nitride layer 130 is formed on the hafnium oxide layer 128 at a low temperature rather than a high temperature, the amount of hafnium chloride produced may be reduced.

Therefore, the method of fabricating the capacitor according to these embodiments improves the performance of the capacitor by forming the first titanium nitride layer 130 on the hafnium oxide layer 128 at a low temperature in comparison with the conventional case to reduce the reaction of the hafnium oxide and the titanium chloride gas.

After the first titanium nitride layer 130 is formed, the supply of the titanium chloride gas and the ammonia gas is stopped. Then, the chamber is purged, and the temperature of the chamber is increased up to about 600° C. Since it takes some time to stably increase the chamber from a low temperature to a high temperature, during this time the semiconductor substrate 100 may be moved to another area of the chamber where other processes may be performed.

Then, the titanium chloride ($TiCl_4$) gas and the ammonia ($NH_3$) gas are flowed on the the first titanium nitride layer 130 at predetermined flow rates, thereby forming a second titanium nitride layer 132 on the first titanium nitride layer. For example, the chamber into which the semiconductor substrate 100 is loaded may be maintained at a temperature of about 600° C. or more and a pressure of about 2.2 to 5 torr. The titanium chloride ($TiCl_4$) gas and the ammonia ($NH_3$) gas are supplied for about 40 to 46 seconds at flow rates of about 30 sccm and about 45 sccm, respectively. At this time, nitrogen gas as dilution gas is supplied into the chamber at a flow rate of about 300 sccm. The second titanium nitride layer 132 is formed by the reaction of the titanium chloride gas and the ammonia gas at a rate of about 5 Å/sec., and may be formed to a thickness of about 200 to 230 Å.

The titanium nitride layer formed by a CVD method contains chlorine from the titanium chloride source gas. However, the chlorine inside the titanium nitride layer is reduced as the temperature increases, as shown in FIG. 3.

So, even though the first titanium nitride layer 130 formed at a low temperature by a CVD process or an ALD process may contain chlorine, the chlorine may be removed during the formation of the second titanium nitride layer 132 using a CVD process at a high temperature.

Therefore, the method of fabricating the capacitor according these embodiments prevents surface damage to the hafnium oxide layer 128 by forming the first titanium nitride layer 130 on the hafnium oxide layer using a low temperature CVD or ALD process, and improves the performance of the capacitor by forming the second titanium nitride layer 132 on the first titanium nitride layer 130 with a high temperature CVD process to reduce the content of the chlorine inside the first and second titanium nitride layers 130, 132.

Figure 2L:
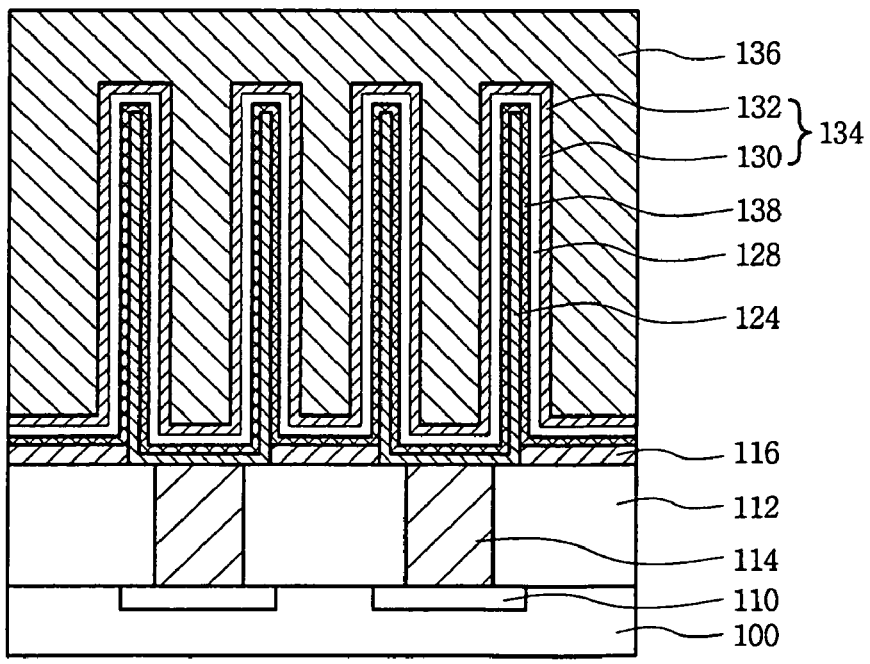

Referring to FIG. 2L, a polysilicon layer 136 doped with conductive impurities is formed on the first and second titanium nitride layers 130, 132 using a CVD process, thereby completing the fabrication of the capacitor. The first titanium nitride layer 130, the second titanium nitride layer 132, and the polysilicon layer 136 may be used as an upper electrode, for example, a plate electrode.

An additional interlayer insulating layer (not shown) may also be formed on the polysilicon layer 136.

Therefore, in the method of fabricating a capacitor according to these embodiments, since the first titanium nitride layer 130 is formed on the hafnium oxide layer 128 by a low temperature CVD or ALD process, and the second titanium nitride layer 132 is formed on the first titanium nitride layer 130 by a high temperature CVD process, damage to the hafnium oxide layer 128 due to the initial low temperature process may be reduced, and the content of the chlorine inside the first and second titanium nitride layers 130, 132 may be reduced, improving both the performance of the capacitor and a production yield.

According to embodiments of the invention, the first titanium nitride layer is formed on the hafnium oxide layer using a low temperature CVD or ALD process, thereby preventing surface damage to the hafnium oxide layer. The second titanium nitride layer is formed on the first titanium nitride layer using a high temperature CVD process, thereby reducing the content of the chlorine inside the first and second titanium nitride layers. Therefore, embodiments of the invention improve the performance of the capacitor, as well as increase or optimize the production yield.

The invention may be practiced in many ways. What follows are exemplary, non-limiting descriptions of some embodiments of the invention.

Embodiments of the invention include forming a first titanium nitride layer on a dielectric layer with a CVD technique or an ALD technique performed at a first temperature using reactant gases of titanium chloride ($TiCl_4$) gas and ammonia ($NH_3$) gas at a predetermined flow ratio, and include forming a second titanium nitride layer on the first titanium nitride layer with a CVD technique performed at a second temperature that is greater than the first temperature using reactant gases of titanium chloride ($TiCl_4$) gas and ammonia ($NH_3$) gas.

According to other embodiments of the invention, a method of forming a titanium nitride layer to prevent charge leakage in a semiconductor capacitor includes forming a first titanium nitride layer on a dielectric layer using a CVD technique or an ALD technique performed at a first temperature with reactant gases of titanium chloride ($TiCl_4$) gas and ammonia ($NH_3$) gas at a predetermined flow ratio, supplying ammonia ($NH_3$) gas on a surface of the first titanium nitride layer, and forming a second titanium nitride layer on the first titanium nitride layer using a CVD technique performed at a second temperature that is greater than the first temperature using reactant gases of titanium chloride ($TiCl_4$) gas and ammonia ($NH_3$) gas.

According to other embodiments of the invention, a method of fabricating a capacitor using a metal electrode to prevent charge leakage includes sequentially forming a lower electrode and a dielectric layer on a semiconductor substrate, supplying titanium chloride ($TiCl_4$) gas on a surface of the dielectric layer, forming a first titanium nitride layer on the dielectric layer using a CVD technique or an ALD technique performed at a first temperature with source gases of titanium chloride ($TiCl_4$) gas and ammonia ($NH_3$) gas supplied at a predetermined flow ratio, supplying ammonia ($NH_3$) gas on a surface of the first titanium nitride layer, forming a second titanium nitride layer on the first titanium nitride layer using a CVD technique performed at a second temperature that is greater than the first temperature with source gases of titanium chloride ($TiCl_4$) gas and ammonia ($NH_3$) gas, and forming a polysilicon layer doped with conductive impurities on the second titanium nitride layer.

According to other embodiments of the invention, a method of fabricating a capacitor with a titanium nitride layer that prevents charge leakage includes forming a lower electrode on a semiconductor substrate, forming a hafnium oxide layer on an overall surface of the lower electrode, supplying titanium chloride ($TiCl_4$) gas on a surface of the hafnium oxide layer, forming a first titanium nitride layer on the hafnium oxide layer using a CVD or ALD technique at a first temperature with source gases of titanium chloride ($TiCl_4$) gas and ammonia ($NH_3$) gas at a predetermined flow ratio, supplying ammonia ($NH_3$) gas on a surface of the first titanium nitride layer, forming a second titanium nitride layer on the first titanium nitride layer using a CVD technique performed at a second temperature that is greater than the first temperature with source gases of titanium chloride ($TiCl_4$) gas and ammonia ($NH_3$) gas, and forming a polysilicon layer doped with conductive impurities on the second titanium nitride layer.

It will be apparent to those skilled in the art that various modifications and alternative arrangements may be made to the exemplary embodiments described above without departing from the inventive aspects of this disclosure. Thus, the invention is not limited by the exemplary embodiments described above, but rather by the attached claims which encompass all such modifications and equivalents.

The invention claimed is:

1. A method comprising:
   depositing a first titanium nitride layer on a dielectric layer using a technique that is performed at a first temperature with reactant gases of titanium chloride ($TiCl_4$) gas and ammonia ($NH_3$) gas at a predetermined flow rate, the technique chosen from the group consisting of a chemical vapor deposition technique and an atomic layer deposition technique; and
   depositing a second titanium nitride layer on the first titanium nitride layer with a chemical vapor deposition technique that is performed at a second temperature that is greater than the first temperature with reactant gases of titanium chloride ($TiCl_4$) gas and ammonia ($NH_3$) gas.

2. The method of claim 1, wherein the first temperature is less than 600° C., and wherein the second temperature is not less than 600° C.

3. The method of claim 2, wherein the first temperature is about 450° C.

4. The method of claim 1, wherein depositing the first and second titanium nitride layers comprise supplying the titanium chloride ($TiCl_4$) gas at a flow rate of about 30 sccm and supplying the ammonia ($NH_3$) gas at a flow rate of about 45 sccm.

5. The method of claim 4, further comprising supplying nitrogen gas into the chamber at a flow rate of about 300 sccm.

6. A method of preventing charge leakage in a semiconductor capacitor, the method comprising:
   forming a dielectric layer over a semiconductor substrate;
   depositing a first titanium nitride layer on the dielectric layer using a chemical vapor deposition technique or an atomic layer deposition technique that is performed at a first temperature with source gases of titanium chloride ($TiCl_4$) gas and ammonia ($NH_3$) gas supplied at a predetermined flow rate;
   supplying ammonia ($NH_3$) gas on a surface of the first titanium nitride layer; and
   depositing a second titanium nitride layer on the first titanium nitride layer using a chemical vapor deposition technique that is performed at a second temperature that is greater than the first temperature with source gases of titanium chloride ($TiCl_4$) gas and ammonia ($NH_3$) gas.

7. The method of claim 6, further comprising, before depositing the first titanium nitride layer, supplying titanium chloride ($TiCl_4$) gas on a surface of the dielectric layer.

8. The method of claim 7, wherein supplying the titanium chloride ($TiCl_4$) gas comprises supplying the titanium chloride ($TiCl_4$) gas for about 1 second.

9. The method of claim 6, wherein forming the dielectric layer comprises forming a hafnium oxide layer.

10. The method of claim 6, wherein the first temperature is less than 600° C., and the second temperature is not less than 600° C.

11. The method of claim 10, wherein the first temperature is about 450° C.

12. The method of claim 6, wherein depositing the first and second titanium nitride layers comprise supplying the titanium chloride ($TiCl_4$) gas at a flow rate of about 30 sccm and supplying the ammonia ($NH_3$) gas at a flow rate of about 45 sccm.

13. The method of claim 12, further comprising supplying nitrogen gas into the chamber at a flow rate of about 300 sccm.

14. The method of claim 6, wherein depositing the first titanium nitride layer and depositing the second titanium nitride layer comprise depositing the first and second titanium nitride layers at a degree of vacuum of 2.2 to 5 torr.

15. The method of claim 6, wherein depositing the first titanium nitride layer comprises depositing the first titanium nitride layer to a thickness of about 20 Å.

16. The method of claim 6, wherein supplying the ammonia ($NH_3$) gas comprises supplying the ammonia ($NH_3$) gas for about 5 seconds.

17. The method of claim 6, wherein depositing the second titanium nitride layer comprises depositing the second titanium nitride layer to a thickness of about 200 to 230 Å.

18. A method of fabricating a capacitor using a metal electrode to prevent charge leakage, the method comprising:
   forming a lower electrode on a semiconductor substrate;
   forming a dielectric layer on the lower electrode;
   supplying titanium chloride ($TiCl_4$) gas on a surface of the dielectric layer;
   depositing a first titanium nitride layer on the dielectric layer using a chemical vapor deposition technique or an atomic layer deposition technique performed at a first temperature with source gases including titanium chloride ($TiCl_4$) gas and ammonia ($NH_3$) gas at a predetermined flow rate;
   supplying ammonia ($NH_3$) gas on a surface of the first titanium nitride layer;
   depositing a second titanium nitride layer on the first titanium nitride layer using a chemical vapor deposition technique performed at a second temperature that is greater than the first temperature and using titanium chloride ($TiCl_4$) gas and ammonia ($NH_3$) gas as source gases; and
   forming a polysilicon layer doped with conductive impurities on the second titanium nitride layer.

19. The method of claim 18, wherein forming the lower electrode comprises:
   sequentially forming an etch stop layer, a mold layer, and a hard mask layer on the semiconductor substrate;
   patterning the hard mask layer to form a hard mask pattern;
   forming a trench in the mold layer and the etch stop layer using the hard mask pattern; and
   filling the trench with a polysilicon layer, the polysilicon layer including conductive impurities.

20. The method of claim 18, wherein forming the dielectric layer comprises:
   forming an alumina layer; and
   forming a hafnium oxide layer on the alumina layer.

21. The method of claim 20, wherein forming the alumina layer comprises forming the alumina layer to a thickness of about 14 to 28 Å.

22. The method of claim 20, wherein forming the hafnium oxide layer comprises forming the hafnium oxide layer to a thickness of about 30 to 40 Å.

23. The method of claim 22, wherein forming the hafnium oxide layer further comprises using a chemical vapor deposition technique or an atomic layer deposition technique.

24. The method of claim 18, further comprising depositing a lower metal layer on the lower electrode using a chemical vapor deposition technique or an atomic layer deposition technique, the lower metal layer composed of a material selected from the group consisting of Ti, Ta, TiN, TaN, TaSiN, TiSiN, WN, and WSiN.

25. The method of claim 18, further comprising, before depositing the first titanium nitride layer, supplying titanium chloride ($TiCl_4$) gas on a surface of the dielectric layer.

26. The method of claim 25, wherein supplying titanium chloride ($TiCl_4$) gas comprises supplying titanium chloride ($TiCl_4$) gas for about 1 second.

27. The method of claim 18, wherein the first temperature is less than 600° C., and the second temperature is not less than 600° C.

28. The method according to claim 27, wherein the first temperature is about 450° C.

29. The method of claim 18, wherein depositing the first and second titanium nitride layers comprise supplying titanium chloride ($TiCl_4$) gas and the ammonia ($NH_3$) gas at flow rates of 30 sccm and 45 sccm, respectively.

30. The method of claim 29, further comprising supplying nitrogen gas into the chamber at a flow rate of about 300 sccm.

31. The method of claim 18, wherein depositing the first and second titanium nitride layers comprise depositing the first and second titanium nitride layers at a degree of vacuum of 2.2 to 5 torr.

32. The method of claim 18, wherein depositing the first titanium nitride layer comprises depositing the first titanium nitride layer to a thickness of about 20 Å.

33. The method of claim 18, wherein supplying ammonia ($NH_3$) gas comprises supplying ammonia ($NH_3$) gas for about 5 seconds.

34. The method of claim 18, wherein depositing the second titanium nitride layer comprises depositing the second titanium nitride layer to a thickness of about 200 to 230 Å.

35. A method of fabricating a capacitor using a titanium nitride layer to prevent charge leakage, the method comprising:
    forming a lower electrode on a semiconductor substrate;
    forming a hafnium oxide layer on a surface of the lower electrode;
    supplying titanium chloride ($TiCl_4$) gas on a surface of the hafnium oxide layer;
    depositing a first titanium nitride layer on the hafnium oxide layer using a chemical vapor deposition technique or an atomic layer deposition technique performed at a first temperature with source gases of titanium chloride ($TiCl_4$) gas and ammonia ($NH_3$) gas at a predetermined flow rate;
    supplying ammonia ($NH_3$) gas on a surface of the first titanium nitride layer;
    depositing a second titanium nitride layer on the first titanium nitride layer using a chemical vapor deposition technique performed at a second temperature that is greater than the first temperature with source gases of titanium chloride ($TiCl_4$) gas and ammonia ($NH_3$); and
    forming a polysilicon layer on the second titanium nitride layer, the polysilicon layer doped with conductive impurities.

36. The method of claim 1, further comprising, after depositing the first titanium nitride layer and before depositing the second titanium nitride layer, supplying ammonia gas ($NH_3$) on a surface of the first titanium nitride layer.

37. The method of claim 1, wherein the first temperature is 450 to 500° C.

38. The method of claim 1, wherein the first titanium nitride layer contains a first amount of chlorine when deposited at the first temperature and the second titanium nitride layer contains a second amount of chlorine when deposited at the second temperature, wherein the first amount of chlorine is greater than the second amount of chlorine.

39. The method of claim 18, wherein the capacitor comprises the lower electrode, the dielectric layer, the first and second titanium nitride layers and the polysilicon layer.

\* \* \* \* \*